(12) United States Patent
Wade et al.

(10) Patent No.: US 11,949,395 B1
(45) Date of Patent: Apr. 2, 2024

(54) POLYPHASE FILTER CONTROL SCHEME FOR FRACTIONAL RESAMPLER SYSTEMS

(71) Applicant: XILINX, INC., San Jose, CA (US)

(72) Inventors: Rhona Wade, Dublin (IE); John Edward McGrath, Tipperary (IE)

(73) Assignee: XILINX, INC., San Jose, CA (US)

( * ) Notice: Subject to any disclaimer, the term of this patent is extended or adjusted under 35 U.S.C. 154(b) by 26 days.

(21) Appl. No.: 17/320,539

(22) Filed: May 14, 2021

(51) Int. Cl.
*H03M 7/00* (2006.01)
*H03H 17/02* (2006.01)
*H03M 1/12* (2006.01)

(52) U.S. Cl.
CPC ........ *H03H 17/0275* (2013.01); *H03M 1/126* (2013.01)

(58) Field of Classification Search
CPC .... H03M 1/1038; H03M 3/358; H03M 3/502; H03M 7/3026; H03M 7/3033; H03M 1/1215; H03M 1/661; H03M 1/785; H03M 3/402; H03M 3/418; H03M 3/462; H03M 5/02; H03M 7/00; H03M 1/0626; H03M 1/0836; H03M 1/747; H03M 3/02; H03M 3/30; H03M 3/344; H03M 3/40; H03M 3/436; H03M 3/50; H03M 3/51; H03M 9/00
USPC .................... 341/61; 375/230, 232, 236, 355
See application file for complete search history.

(56) References Cited

U.S. PATENT DOCUMENTS

| | | | | |
|---|---|---|---|---|
| 5,345,273 A * | 9/1994 | Sun | ......... | H04N 5/211 348/614 |
| 5,420,884 A * | 5/1995 | Inoue | ......... | H04L 25/03038 708/322 |
| 5,768,311 A * | 6/1998 | Betts | ......... | H04L 5/16 375/232 |
| 5,892,695 A * | 4/1999 | Van Dalfsen | ......... | H04N 5/14 348/E5.062 |
| 5,928,313 A * | 7/1999 | Thompson | ......... | G06T 3/4023 708/313 |
| 6,058,406 A * | 5/2000 | Karanovic | ......... | H03L 7/1974 708/313 |
| 6,260,053 B1 * | 7/2001 | Maulik | ......... | H03H 17/06 708/319 |
| 6,573,940 B1 * | 6/2003 | Yang | ......... | H04N 5/208 348/625 |
| 7,864,080 B1 * | 1/2011 | Demirsoy | ......... | H03H 17/0275 708/313 |
| 8,073,282 B2 * | 12/2011 | Teng | ......... | G06T 5/004 382/298 |
| 8,786,472 B1 * | 7/2014 | Prince | ......... | H03M 5/02 341/123 |
| 9,319,058 B1 * | 4/2016 | Yu | ......... | H03M 1/1038 |

(Continued)

Primary Examiner — Linh V Nguyen
(74) Attorney, Agent, or Firm — Patterson + Sheridan, LLP

(57) ABSTRACT

Embodiments herein describe a hardened fractional resampler that includes a fixed filter that supports simultaneous processing of N input samples with minimal additional combinational logic and no additional multipliers. In one embodiment, the fractional resampler is implemented in an integrated circuit using hardened circuit. The embodiments below exploit a pattern in the order filter phases in fractional resampling systems (such as a SSR resampling system) to use filter phases in a single fixed filter to process multiple input samples in parallel, where these filter phases would have been unused in previous resampling systems.

19 Claims, 6 Drawing Sheets

(56) References Cited

U.S. PATENT DOCUMENTS

| | | | |
|---|---|---|---|
| 9,755,864 B1* | 9/2017 | Ali Shah | H04L 25/03885 |
| 2010/0321216 A1* | 12/2010 | Jonsson | H03M 5/02 |
| | | | 341/61 |

* cited by examiner

POLYPHASE FILTER CONTROL SCHEME FOR FRACTIONAL RESAMPLER SYSTEMS

TECHNICAL FIELD

Examples of the present disclosure generally relate to operating fractional resampler systems.

BACKGROUND

A fractional resampler modifies the sample rate of data by some rational factor P/Q. To do this it up-samples by P, applies a low-pass filter, and down-samples by Q. A super sample rate (SSR) fractional resampler takes N input samples and produces N*P/Q output samples on average. A typical field programmable gate array (FPGA) implementation of a SSR fractional resampler includes filter multiplier values stored in memory. Only outputs that will be retained after down-sampling are computed, so a different set of coefficients are loaded from memory depending on which filter phase should be active. This supports any arbitrary value of P/Q (i.e., provides increased flexibility), but this flexibility is typically not needed in many situations and the large full multipliers used in a programmable filter consume more power than the equivalent fixed coefficient filter implementations.

A typical application specific integrated circuit (ASIC) implementation of a SSR fractional resampler includes fixed coefficient filters with fixed P/Q ratios based on a polyphase interpolator structure. The fixed coefficient filters are much more area and power efficient than the programmable filters in the FPGA programmable filters. However, the standard fixed filter implementation cost scales directly with increase in N (i.e., the number of input samples). Since down sampling means that not every filter phase in the fixed coefficient filters is used on every clock cycle, for high values of N a set of ceiling (NP/Q) programmable filter may become more cost effective even when support for arbitrary P/Q is unnecessary. Thus, the ASIC fractional resampler, while having power savings, requires a large space to support N number of sets of fixed coefficient filters.

SUMMARY

One example is a fractional resampling circuit that includes a fixed coefficient filter comprising a plurality of filter phases and a delay line configured to provide a plurality of input samples to the plurality of filter phases such that the plurality of filter phases processes the plurality of input samples in parallel according to a resampling ratio, and generate a plurality of output samples in a same clock cycle.

One example described herein is an integrated circuit that includes a fixed coefficient filter comprising a plurality of filter phases and a delay line configured to provide a plurality of input samples to the plurality of filter phases such that the plurality of filter phases processes the plurality of input samples in parallel according to a resampling ratio, and generate a plurality of output samples in a same clock cycle.

One example described herein is a fractional resampling circuit that includes a fixed coefficient filter comprising a plurality of filter phases and a delay line configured to provide a plurality of N input samples to the plurality of filter phases such that at least two of the plurality of filter phases process the plurality of N input samples in parallel according to a resampling ratio P/Q, and generate, on average, N*P/Q output samples each clock cycle.

BRIEF DESCRIPTION OF DRAWINGS

So that the manner in which the above recited features can be understood in detail, amore particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
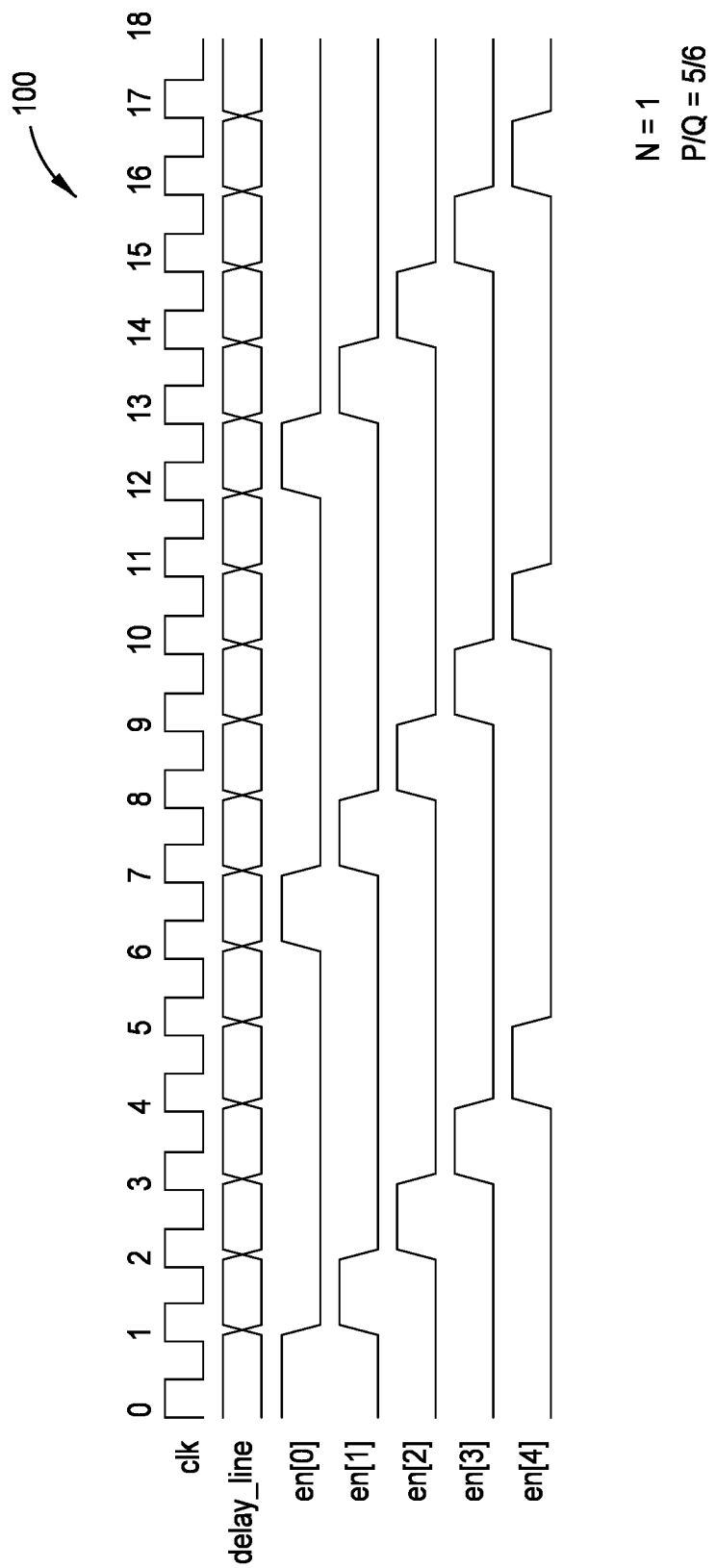
FIG. 1 is a timing chart illustrating a resampling system where filter phases are unused, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe a hardened fractional resampler that has the power savings of the typical ASIC implementation of a resampler but avoids the large increase of area relative to an FPGA implementation of a resampler. Put differently, the fractional resampler described herein can save area relative to the typical ASIC implementation and save power relative to the FPGA implementations. The fractional resampler can include a single fixed filter that supports simultaneous processing of N input samples with minimal additional combinational logic and no additional multipliers, which is a very low incremental cost compared to the fixed filters used in a typical ASIC implementation. Achieving fractional resampling through fixed filter implementation also provides a significant reduction in power when compared to a FPGA filter implementation.

In one embodiment, the fractional resampler is implemented in an ASIC using hardened circuit, but that is not a requirement. The resampler described herein could be implemented using programmable logic in a FPGA, or be part of a System on Chip (SoC). The embodiments below exploit a pattern in the order filter phases in fractional resampling systems (such as a SSR resampling system) to use filter phases in a single fixed filter to process multiple input samples in parallel, where these filter phases would have been unused in previous resampling systems.

FIG. 1 is a timing chart 100 illustrating a resampling system where filter phases are unused, according to an example. In FIG. 1, it is assumed that the number of input samples (N) is one. Further, the corresponding resampling system includes a fixed filter (i.e., a fixed coefficient filter) with five filter phases (i.e., a P=5 polyphase interpolator) where the filter phases are enabled using five enable signals en[0-4]. A delay line is used to provide the input samples to the fixed filter.

The chart 100 illustrates a resampling ratio P/Q of 5/6. As shown by the enable signals en[0-4], during each clock cycle only one of the filter phases in the fixed filter is active, while the other four filter phases are inactive. Put differently, only one of the filter phases receives an input sample and generates a new sample at the new sampling ratio (i.e., 5/6). As such, FIG. 1 illustrates a pattern for the particular resampling ratio (5/6) where only one phase of the fixed filter is used any given clock cycle. However, the unused phases in an ASIC implementation can be powered down, thus saving power relative to an FPGA implementation.

However, if N is greater than one, then another fixed filter is needed to generate an output sample if the same resampling scheme is used. That is, the resampling circuit uses two fixed filters with five filter phases each to process two input samples each clock cycle. Instead, the embodiments below describe a resampling circuit with a fixed filter that can process multiple input samples in parallel. That is, the same fixed filter can generate outputs for multiple input samples each clock cycle, thus providing an area savings of up to half a resampling system with two separate fixed filters. Further, any unused filter phases in the fixed filter can be powered down in the clock cycles they are not being used, thus providing the same power savings as a resampling system with fixed filters that output single output samples.

The sequence of enabled filter phases used during a clock cycle is given by the following equation:

$$k_n = (nQ) \mod P \quad (1)$$

where P and Q are interpolation and decimation rates, n is the index of the output clock and kn gives the index of the phase used to produce output n. For a filter with P filter phases where the output is taken from every $Q^{th}$ phase, the phase k producing the $n^{th}$ output is determined by the following equation:

$$k = (nQ) \mod P \quad (2)$$

From this it was observed that for mutually prime P and Q, only every $P^{th}$ output from phase k is retained following down sampling. Phase k will not be re-used before P output samples have been calculated. In a system producing P/Q output samples per clock cycle, this will occur only after Q clock cycles. The filter phases can then be used to process other input samples as described below.

Taking N samples per clock cycle will mean producing an average of NP/Q output samples per clock cycle. Thus if NP/Q≤P, i.e. if N≤Q, then all outputs for N consecutive input samples can be simultaneously computed with a single set of filter taps. For example, if N=3, P=7, and Q=4, then the resampling system is being asked to, every clock cycle, generate output samples for three input samples N with a new sampling ratio of 7/4. Since N is less than Q in this example, this means a single fixed filter can process all three inputs samples in parallel. That is, P/Q=1.75 which means every input sample generates, on average, 1.75 output samples per clock cycle which can be calculated using at most two filter phases. Because the fixed filter has seven filter phases (P=7), it has sufficient free filter phases that can process the other two input samples so that every clock cycle the fixed filter outputs, on average, NP/Q=5.25 output samples. However, if N is greater than Q (e.g., N=4, P=7, and Q=3), then the fixed filter would need to output, on average, NP/Q=9.3 output samples every clock cycle. Since the fixed filter only has seven filter phases, it is unable to process four input samples (at that resampling ratio) in parallel every clock cycle. In that case, the fixed filter could process three input samples in parallel to generate NP/Q=7 output samples each cycle at the desired resampling ratio, and then another fixed filter in the resampling system could be used to process the fourth input sample. Alternatively, instead of using another fixed filter, the same fixed filter could be used to process three of the input samples of a first clock cycle and then use the subsequent clock cycle to process the fourth input sample, and so forth each time a new set of four input samples are received.

Figure 2:
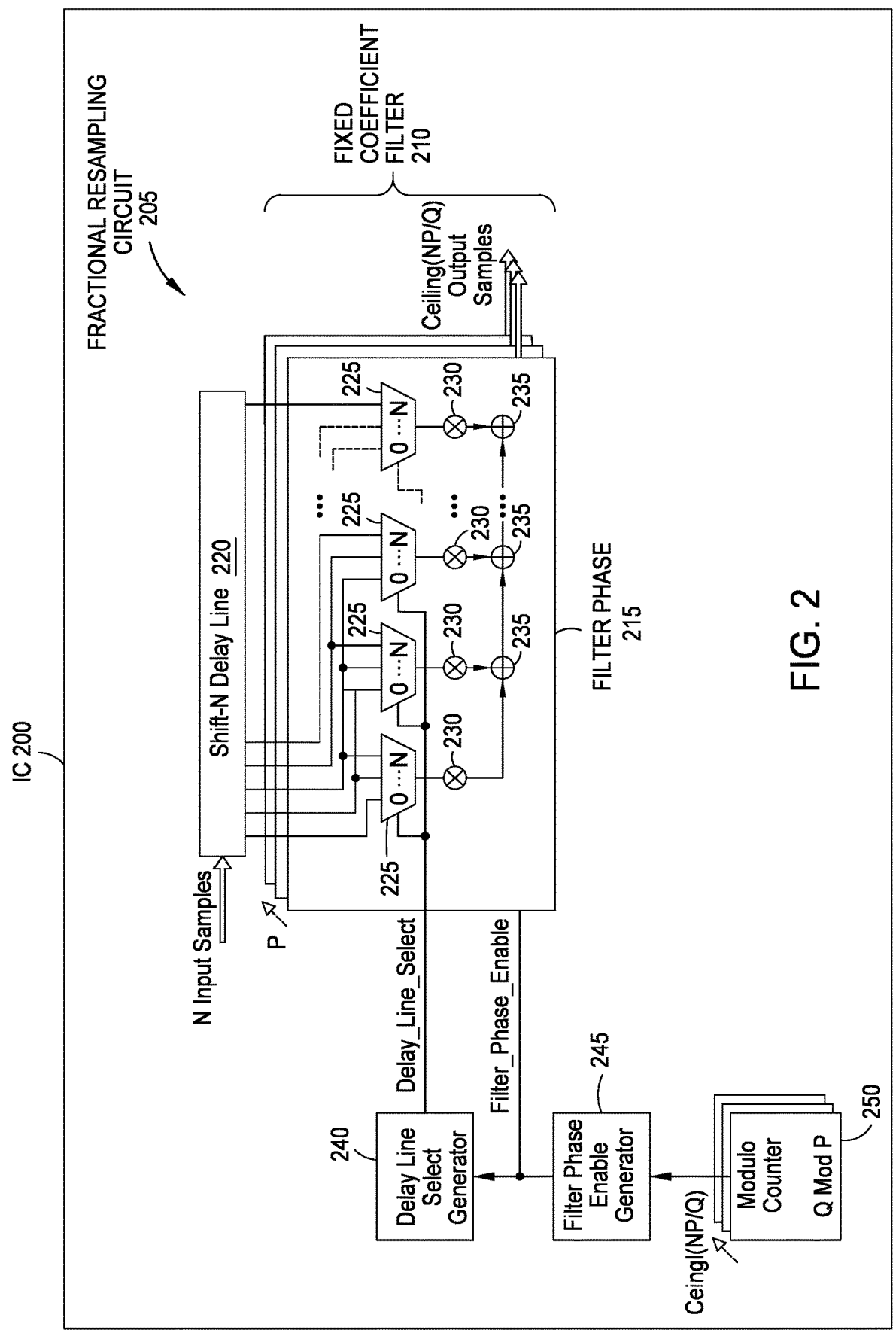
FIG. 2 illustrates an integrated circuit with a fractional resampling circuit, according to an example.

FIG. 2 illustrates an integrated circuit (IC) 200 with a fractional resampling circuit 205, according to an example. The IC 200 can be an ASIC, FPGA, SoC, etc. As such, the IC 200 can include entirely hardened circuitry, or a mix of hardened circuitry and programmable logic (e.g., configurable logic blocks). In one embodiment, the fractional resampling circuit 205 includes only hardened circuitry.

The resampling circuit 205 includes at least one fixed coefficient filter 210 which has a set number of filter phases 215 (which correspond to the variable P discussed above). Each of the filter phases 215 include a set of multiplexers 225 for selecting from one of the N number of input samples to provide to multipliers 230 and adders 235 (e.g., filter taps) that generate the NP/Q output samples. That is, using the multiplexers 225, anyone of the N input samples can be input into anyone of the filter phases 215. Thus, in parallel, one of the filter phase 215 can process a first input sample, a second filter phase 215 can process a second input sample, a third filter phase 215 can process a third input sample, and so forth.

The inputs of the multiplexer 225 are connected to a delay line 220 which stores the N input samples. The delay line 220 can store the N input samples as they are received and then output each of the input samples to the multiplexers 225. The multiplexers 225 in the same filter phase 215 receive the same select line such that each of the multiplexers 225 selects the same input sample. On average, the filter phases 215 output NP/Q output samples every clock cycle. For example, if NP/Q=5.5, then during one clock cycle, five of the filter phases 215 output a sample, during the next clock cycle, six of the filter phases 215 output a sample, during the next clock cycle, five of the filter phases 215 output a sample, during the next clock cycle, six of the filter phases 215 output a sample, and so forth. If a filter phase 215 is not used during a particular clock cycle, it can be deactivated, thereby saving power.

The multiplexers 225 and the shift-N delay line 220 permit the fixed coefficient filter 210 to process multiple input samples in parallel. In contrast, a typical ASIC implementation of a SSR fractional resampler uses duplicates of a fixed coefficient filter (which do not have the multiplexers 225 connected to a shift-N delay line 220) to process a respective input sample in parallel. However, the fixed coefficient filter 210 in FIG. 2 can process multiple input samples N so long as N is less than or equal to Q. That is, the fixed coefficient filter 210 can process up to Q number of input samples in parallel. If the user desires to process more than Q number of input samples, then the fractional resampling circuit 205 can include a duplicate fixed coefficient filter 210 for processing the extra input sample in parallel. Or the fixed coefficient filter 210 could process the extra input samples in a different (e.g., subsequent) clock cycle; however, while the system can process more than Q input samples by using subsequent cycles, it reduces the effective sample rate.

The fractional resampling circuit 205 also includes modulo counters 250 that generate counts using Q mod P. As shown, the resampling circuit 205 includes NP/Q number of counters 250.

The outputs of the counters 250 are coupled to a filter phase enable generator 245 (e.g., a filter phase enable circuit) which outputs filter_phase_enable signals (e.g., the en[0-4] signals illustrated in FIG. 1). These signal determine, for a particular clock cycle, which of the filter phases 215 are active and generate an output sample and which are inactive, thereby conserving power. For example, during a first clock cycle, the filter_phase_enable signals may activate all of the filter phases 215, but during the subsequent clock cycle, only a sub-portion of the filter phases 215 are active while the remaining filter phases 215 are inactive (e.g., unpowered). The details of the counters 250 and the filter phase enable generator 245 are discussed in more detail in FIGS. 3 and 4 below.

In addition to transmitting the enable signals to the filter phases 215, these signals are also provided to a delay line select generator 240 (e.g., a delay line select circuit) which outputs the select line signal (i.e., the delay_line_select) for the multiplexers 225 in an active filter phase 215. That is, the delay line select generator 240 determines which of the N number of input samples a particular filter phase 215 processes during the current clock cycle. For example, the delay line select generator 240 can instruct the multiplexers 225 in a first filter phase 215 to process a first input sample, instruct the multiplexers 225 in a second filter phase 215 to process a second input sample during the same clock cycle, and so forth.

Figure 3:
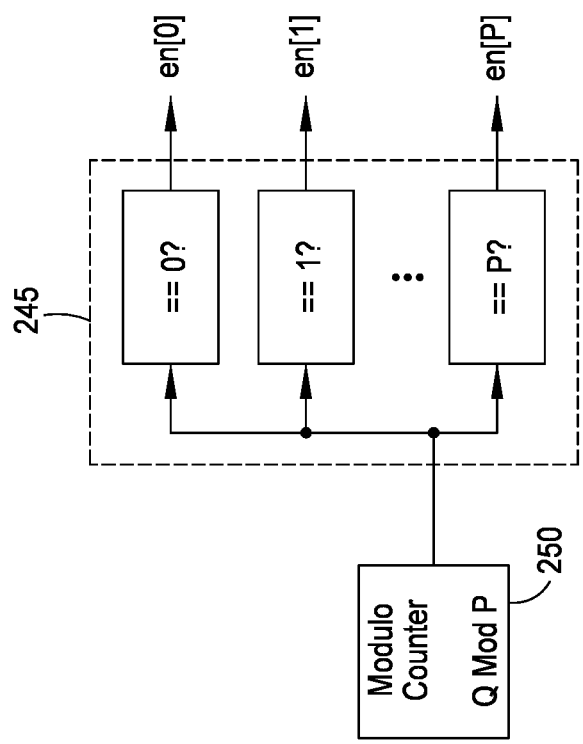
FIG. 3 illustrates a filter phase enable generator, according to an example.

FIG. 3 illustrates a filter phase enable generator 245, according to an example. Specifically, FIG. 3 illustrates the modulo counter 250 and the filter phase enable generator 245 generating enable signals for the filter phases (e.g., the filter phases 215 in FIG. 2). This generic architecture of the generator 245 can support any P, Q, N configuration. To produce a sequence for SSR of N input samples, the increment of the counter 250 should be NQ and the initial values of each of the NP/Q counters 250 should be offset by Q. This architecture illustrated in FIG. 3 can be duplicated NP/Q times in the fixed coefficient filter 210 in FIG. 2.

Figure 4:
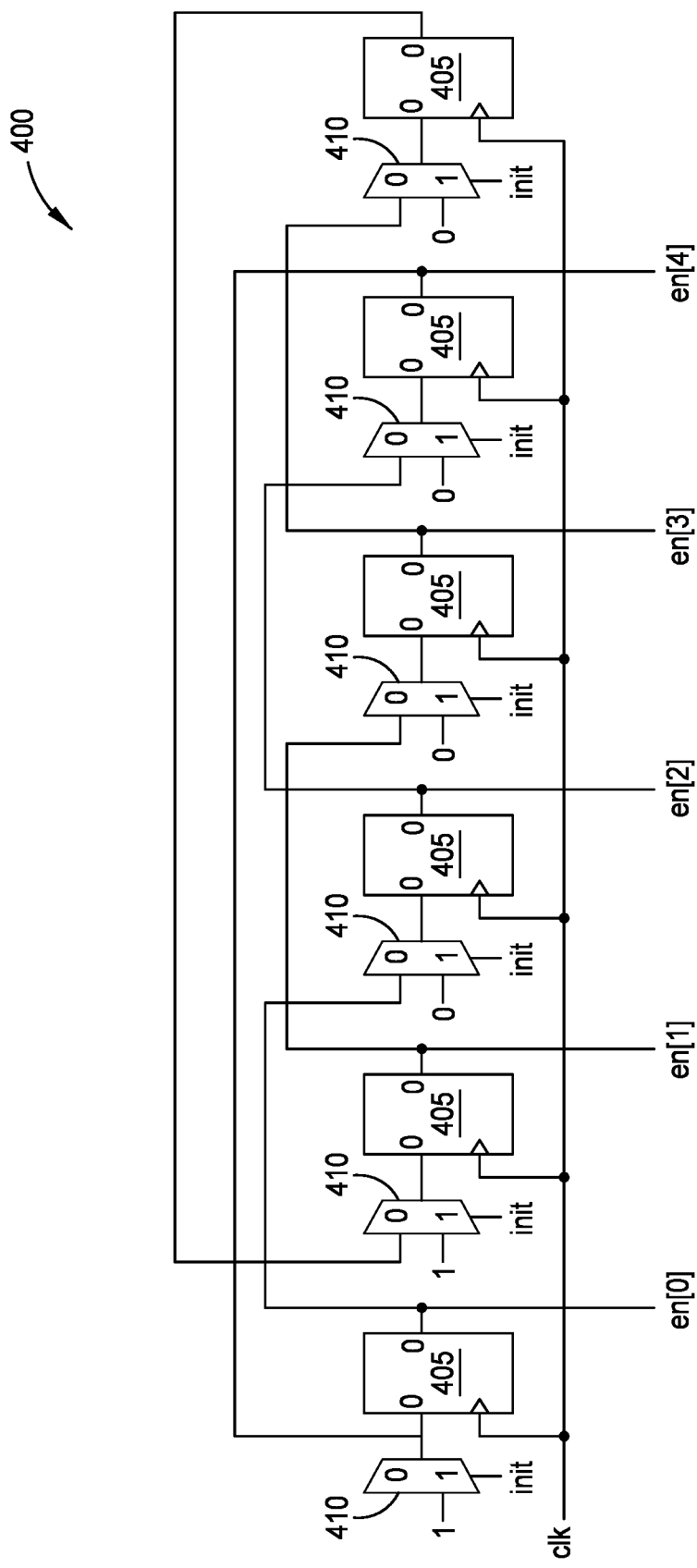
FIG. 4 illustrates a fixed filter phase enable generator, according to an example.

FIG. 4 illustrates a fixed filter phase enable generator scheme for a specific N, P/Q configuration, according to an example. For example, in cases where P, Q, and N are fixed, the sequence for generating the enable signals can be implemented using the shift register 400 illustrated in FIG. 4. That is, the shift register 400 in FIG. 4 can be used as the filter phase enable generator 245 when the values of P, Q, and N do not change (e.g., are not configurable in the resampling circuit 205). In FIG. 4, P/Q is 5/6 and N=2, where registers 405 are initialized via inputs provided by multiplexers 410.

Returning to FIG. 2, in cases where P>Q, the same fixed coefficient filter 210 can support multiple values of Q by alteration of the control scheme—e.g., by altering the parameters of the counters 250. For systems where Q>P, the polyphase interpolator structure of the fixed coefficient filter 210 can still be used if the filter's bandwidth is determined by Q and the filter taps (e.g., coefficient values for the multipliers 230) are divided into P phases. In this case, the filter 210 resamples by a single P/Q value at reduced cost compared to a more variable polyphase decimator structure. Further, using the polyphase interpolator structure in FIG. 2 is compatible with a control scheme for handling SSR inputs which can avoid any need for parallel instantiations of the filter 210 in the resampling circuit 205. This control scheme can be achieved using the multiplexers 225 and the signals provided by the counters 250, phase enable generator 245, and the delay line select generator 240.

In one embodiment, the fixed coefficient filter 210 may output the samples in an incorrect order. This may occur when not all of the filter phases 215 are being used during a clock cycle. In the single input case (N=1), the order of the data at the output is based on which filter phase 215 produced it. A higher indexed subset of the filter taps in the filter phase 215 produces a later output sample from the same data. However, for the control scheme disclosed here, a lower indexed subset of filter taps may process data for a later input sample. In that case, the output sample can be re-ordered based on which input sample was used to produce it. An example buffer circuit to allow arbitrary re-ordering could use P-to-1 multiplexers. This buffer circuit can be placed at the outputs of the filter phases 215. This re-ordering scheme is used in a resampling circuit 205 supporting a number of different P, Q, and N configurations. Otherwise, the reordering can be further specialized or statically implemented to support a single configuration more efficiently.

The fixed coefficient filter 210, and the control structure to support its use, allows a single polyphase interpolator to process N input samples simultaneously where N ≤ Q. This provides an implementation cost reduction close to a factor of N, while keeping power consumption low by avoiding the use of programmable fitters. Maintaining low power consumption at low-cost, while still providing flexibility as provided by the fractional resampling circuit 205 is important for many application, for example Digital Front-Ends in 4G/5G radios.

Further, the concepts illustrated in FIG. 2 can be extended to multi-stage filters, or further hardening of some control schemes for specific values of P, Q, and N. For instance, to support more variability on N than Q, a gearbox could be used to receive N samples per clock cycle and shift Q samples at a time into the delay line. This would avoid the need for multiplexing inputs to filter multipliers or multiplexing at the output due to mis-ordered output samples. An example of such a system is shown in FIG. 5.

Figure 5:
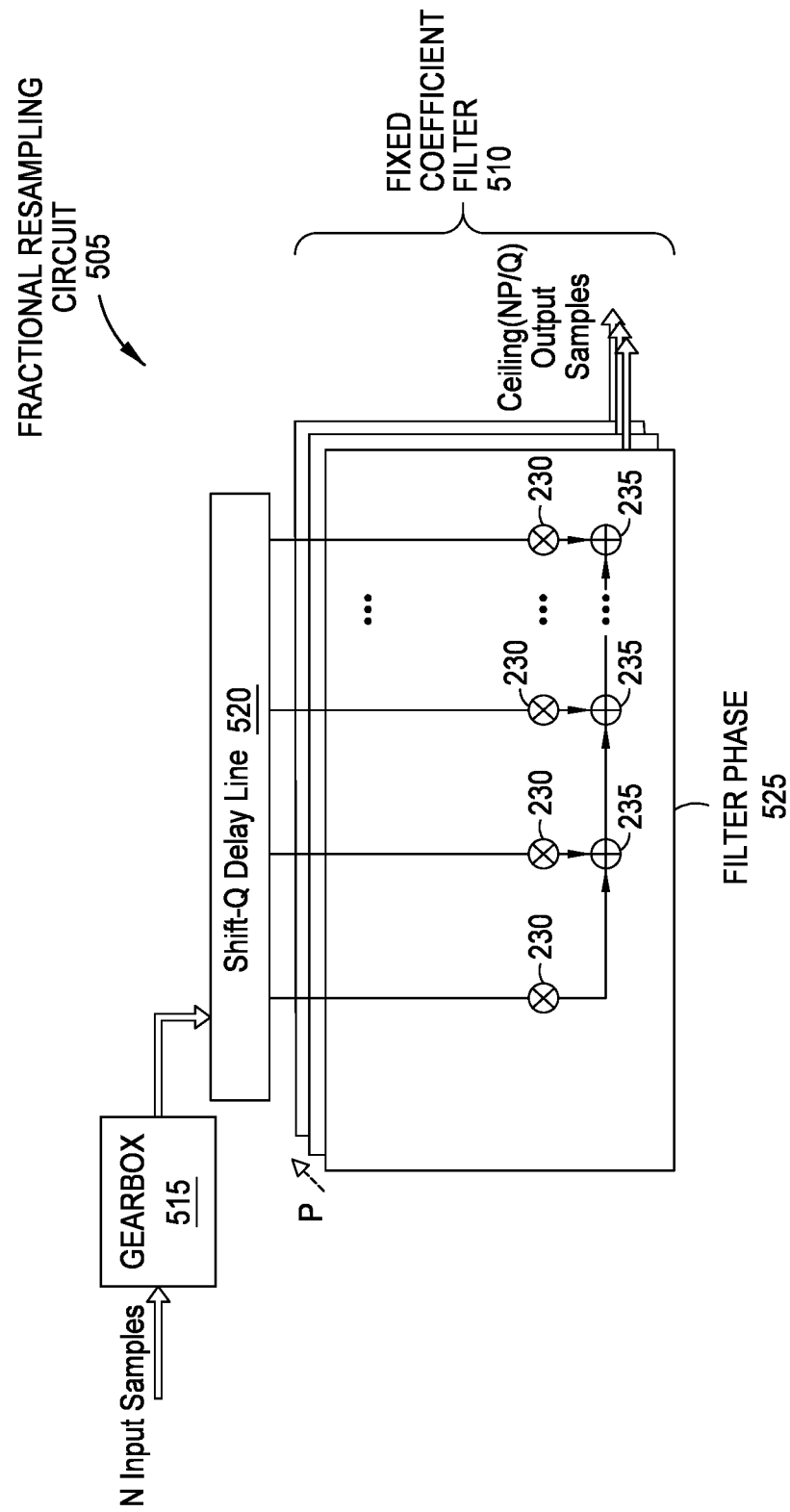
FIG. 5 illustrates an integrated circuit with a fractional resampling circuit, according to an example.

FIG. 5 illustrates a fractional resampling circuit 505 with a fixed coefficient filter 510 that can process a fixed number of input samples each clock cycle. That is, like the filter 210 in FIG. 2, the filter 510 can process multiple input samples in parallel. However, unlike the filter 210, the filter 510 can only process the same number of inputs samples (i.e., Q) each clock cycle. However, by fixing Q, this means the multiplexers 225 in FIG. 2 can be omitted from the filter phases 525 in FIG. 5. Alternatively, a variable-shift-k delay-line can instead be used to support varying Q values. This is how a varying N is supported in the implementation illustrated in FIG. 2. A variable-shift-k delay-line can include a k-to-1 multiplexer on the input to each register, so its complexity increases with k. Thus, if a designer is choosing between shifting a variable Q vs shifting a variable N, her decision will depend on which is more variable (although the shift-Q delay line 520 in FIG. 5 has the benefit of no multiplexers on multiple inputs, no modulo counters 250, no filter phase enable generator 245, etc.). Also, because the multiplexers 225 are not needed, the control scheme for the filter 510 in FIG. 5 also does not need the delay line select generator 240.

As mentioned already, the filter phase enable generator 245 and counter 250 are not used in FIG. 5. Instead, a single enable single can trigger all the filter phases 525 whenever the Q new input samples had been shifted in from the gearbox 515. This happen every Q/N clock cycles on average. The same signal enabling the delay-line 520 could be delayed by one clock cycle and used to enable the filter phases 525.

The control scheme for receiving input samples in FIG. 5 is different from FIG. 2. Here, the resampling circuit 505 includes a gearbox 515 that can receive N number of input samples (where N can be a user defined parameter that varies). The gearbox 515 shifts Q number of samples into the delay line 520 each clock cycle. The delay line 520 in turn passes the Q number of samples to the filters phases 525 so they can be processed in parallel. In this manner, for systems where N can vary but Q remains fixed, the fixed coefficient filter 510 may be preferred over the filter 210 in FIG. 2. However, the filter 210 may be preferred if Q has a higher degree of variability than N. Thus, the filter 210 in FIG. 2 provides greater flexibility, while the filter 510 in FIG. 5 may be more cost effective to implement and have a smaller footprint.

Figure 6:
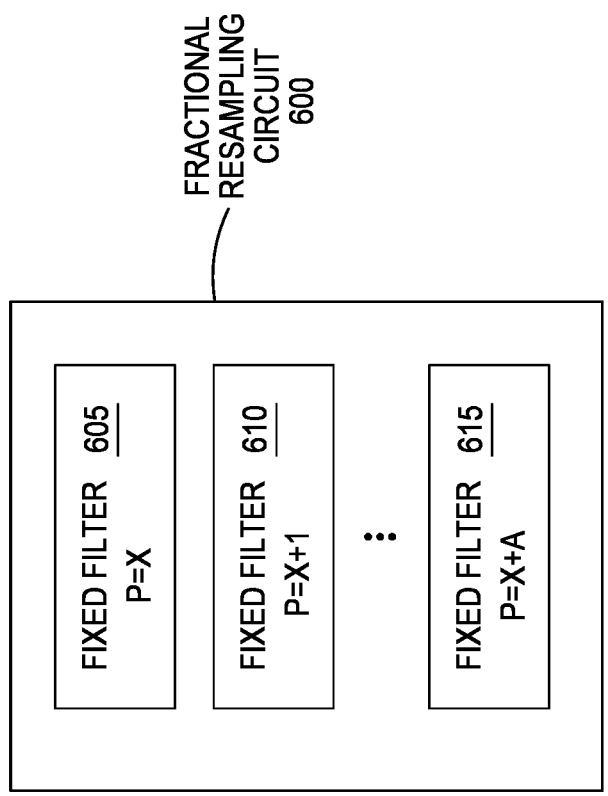
FIG. 6 illustrates a fractional resampling circuit with multiple fixed coefficient filters, according to an example.

FIG. 6 illustrates a fractional resampling circuit 600 with multiple fixed coefficient filters, according to an example. In one embodiment, the fractional resampling circuit 600 is part of an IC, such as a digital front-end of the IC.

In this example, the resampling circuit 600 includes multiple fixed coefficient filters 605, 610, and 615 for different interpolation rates P. The user (or an application) can select which of the fixed filters to use depending on the value of P in the resampling ratio P/Q. In this example, the resampling circuit 600 supports a fixed range of P values (e.g., 2-7) where each P value corresponds to one of the fixed filters. If the application wants to switch to a different P value, then the resampling circuit 600 may activate the corresponding fixed filter for that P value.

While the resampling circuit 600 includes a different fixed filter for each value of P, the resampling circuit 600 does not need to include N instances of those filters. That is, previous ASIC implementations of a SSR fractional resampler require N copies of the set of filters in FIG. 6 in order to support different input samples being processed in parallel. However, by implementing the fixed filters 605, 610, and 615 using the filter designs illustrated in FIG. 2 or 5, the same set of fixed filters in the resampling circuit 600 can process various numbers of inputs samples in parallel. That is, the same set of fixed filters can support different values of N. Thus, the resampling circuit 600 (using the filter designs illustrated in FIG. 2 or 5) can significantly reduce the area of a resampling circuit that supports processing a range of input samples in parallel when compared to previous ASIC implementations of a SSR fractional resampler.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the users computer and partly on a remote computer or entirely on the remote computer or server. In the latter scenario, the remote computer may be connected to the users computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A fractional resampling circuit, comprising:
    a fixed coefficient filter comprising a plurality of filter phases, wherein a first filter phase, of the plurality of filter phases, comprises a first plurality of filter taps configured to receive a first same input sample from a plurality of input samples in parallel, and a second filter phase, of the plurality of filter phases, comprises a second plurality of filter taps configured to receive a second same input sample from the plurality of input samples in parallel; and
    a delay line configured to provide the plurality of input samples to the plurality of filter phases such that the plurality of filter phases processes the plurality of input samples in parallel according to a resampling ratio, and generate a plurality of output samples in a same clock cycle.

2. The fractional resampling circuit of claim 1, wherein the fixed coefficient filter and the plurality of filter phases are implemented using hardened circuitry in an integrated circuit.

3. The fractional resampling circuit of claim 1, wherein the first filter phase in the plurality of filter phases processes the first same input sample of the plurality of input samples to generate a first output sample of the plurality of output samples in the same clock cycle that the second filter phase in the plurality of filter phases processes the second same input sample of the plurality of input samples to generate a second output sample of the plurality of output samples.

4. The fractional resampling circuit of claim 1, wherein a number (N) of the plurality of input samples is less than or equal to a down sampling value (Q) of the resampling ratio.

5. The fractional resampling circuit of claim 1, wherein the first filter phase includes a plurality of multiplexers, wherein inputs of the plurality of multiplexers are connected to the delay line to receive the first same input sample and outputs of the plurality of multiplexers are connected to the first plurality of filter taps.

6. The fractional resampling circuit of claim 1, further comprising:
    a delay line select circuit configured to output select signals to the plurality of filter phases to control which of the plurality of filter phases processes with of the plurality of input samples during the same clock cycle.

7. A fractional resampling circuit, comprising:
    a fixed coefficient filter comprising a plurality of filter phases; and
    a delay line configured to provide a plurality of input samples to the plurality of filter phases such that the plurality of filter phases processes the plurality of input samples in parallel according to a resampling ratio, and generate a plurality of output samples in a same clock cycle;
    at least one modulo counter configured to increment based on Q mod P where Q is a down sampling value (0) of the resampling ratio and P is the number of the plurality of filter phases; and
    a filter phase enable circuit coupled to the output of the at least one modulo counter and configured to output phase enable signals to indicate which of the plurality of filter phases are used to process the plurality of input samples during the same clock cycle.

8. The fractional resampling circuit of claim 7, wherein the phase enable signals indicate that at least one of the plurality of filter phases is inactive during the same clock cycle.

9. The fractional resampling circuit of claim 1, further comprising:
    a gearbox configured to receive an N number of input samples and output, to the delay line, a Q number of the plurality of input samples, wherein Q is a down sampling value (Q) of the resampling ratio.

10. The fractional resampling circuit of claim 9, wherein Q is a fixed value that does not change, and wherein the delay line is connected to the first plurality of filter taps in the first filter phase without the use of multiplexers.

11. The fractional resampling circuit of claim 1, further comprising:
a plurality of fixed coefficient filters each corresponding to different P values of the resampling ratio, wherein the P values are up-sample values of the resampling ratio.

12. An integrated circuit, comprising:
a fixed coefficient filter comprising a plurality of filter phases, wherein a first filter phase, of the plurality of filter phases, comprises a first plurality of filter taps configured to receive a fir same input sample from a plurality of input samples in parallel, and a second filter phase, of the plurality of filter phases, comprises a second plurality of filter taps configured to receive a second same input sample from the plurality of input samples in parallel; and
a delay line configured to provide the plurality of input samples to the plurality of filter phases such that the plurality of filter phases processes the plurality of input samples in parallel according to a resampling ratio, and generate a plurality of output samples in a same clock cycle.

13. The integrated circuit of claim 12, wherein the first filter phase in the plurality of filter phases processes the first same input sample of the plurality of input samples to generate a first output sample of the plurality of output samples in the same clock cycle that the second filter phase in the plurality of filter phases processes the second same input sample of the plurality of input samples to generate a second output sample of the plurality of output samples.

14. The integrated circuit of claim 12, wherein a number (N) of the plurality of input samples is less than or equal to a down sampling value (Q) of the resampling ratio.

15. The integrated circuit of claim 6, wherein the first filter phase includes a plurality of multiplexers, wherein inputs of the plurality of multiplexers are connected to the delay line to receive the first same input sample and outputs of the plurality of multiplexers are connected to the first plurality of filter taps,
wherein the integrated circuit comprises:
a delay line select circuit configured to output select signals to the plurality of filter phases to control which of the plurality of filter phases processes with of the plurality of input samples during the same clock cycle.

16. The integrated circuit of claim 12, further comprising:
at least one modulo counter configured to increment based on Q mod P where Q is a down sampling value (Q) of the resampling ratio and P is the number of the plurality of filter phases; and
a filter phase enable circuit coupled to the output of the at least one modulo counter and configured to output phase enable signals to indicate which of the plurality of filter phases are used to process the plurality of input samples during the same clock cycle, wherein the phase enable signals indicate that at least one of the plurality of filter phases is inactive during the same clock cycle.

17. The integrated circuit of claim 12, further comprising:
a gearbox configured to receive an N number of input samples and output, to the delay line, a Q number of the plurality of input samples, wherein Q is a down sampling value (Q) of the resampling ratio.

18. The integrated circuit of claim 12, further comprising:
a plurality of fixed coefficient filters each corresponding to a different P value of the resampling ratio, wherein the P value is an up-sample value of the resampling ratio.

19. The fractional resampling circuit of claim 1, wherein the first filter phase is configured to sum the outputs of the first plurality of filter taps.

* * * * *